(12) United States Patent
Chen et al.

(10) Patent No.: US 6,271,556 B1
(45) Date of Patent: *Aug. 7, 2001

(54) HIGH DENSITY MEMORY STRUCTURE

(75) Inventors: Min-Liang Chen; Nan-Hsiung Tsai, both of Hsinchu (TW)

(73) Assignee: Mosel Vitelic, Inc., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,758

(22) Filed: Jan. 14, 1998

Related U.S. Application Data

(62) Division of application No. 08/598,258, filed on Feb. 7, 1996, now Pat. No. 5,792,686.
(60) Provisional application No. 60/001,810, filed on Aug. 4, 1995.

(51) Int. Cl.[7] ......................... H01L 27/108; H01L 29/76
(52) U.S. Cl. ......................... 257/303; 257/301; 257/306
(58) Field of Search ..................... 257/296–301, 257/302–309, 905, 906, 907, 908; 43/244, 243, 245–249

(56) References Cited

U.S. PATENT DOCUMENTS

| | | | |
|---|---|---|---|
| 4,894,695 | 1/1990 | Ishi et al. | 438/248 |
| 4,912,535 * | 3/1990 | Okumura | 257/301 |
| 4,918,500 * | 4/1990 | Inuishi | 257/303 |
| 4,990,463 * | 2/1991 | Mori | 438/386 |
| 5,026,659 * | 6/1991 | Lee | 438/244 |
| 5,234,856 * | 8/1993 | Gonzalez | 438/244 |
| 5,250,831 * | 10/1993 | Ishii | 257/305 |
| 5,273,928 | 12/1993 | Tani | 438/386 |
| 5,466,628 * | 11/1995 | Lee et al. | 438/244 |
| 5,521,111 | 5/1996 | Sato | 438/244 |
| 5,594,682 * | 1/1997 | Lu et al. | 257/296 |
| 5,900,659 * | 5/1999 | Lee | 257/296 |

FOREIGN PATENT DOCUMENTS 6-61446 * 3/1994 (JP) .

OTHER PUBLICATIONS

Wolf et al., "Chemical Vapor Deposition of Amorphous and Polycrystalline Films"; Silicon Processing for the VLSI Era, vol. I; Lattice Press, California; 1986; pp. 181–182.
Y. Kohyama et al., "Buried Bit–Line Cell for 64MB DRAMs", 1990 Symposium on VLSI Technology, pp. 17–18.

* cited by examiner

Primary Examiner—Steven Loke
Assistant Examiner—Hung Kim Vu
(74) Attorney, Agent, or Firm—Townsend and Townsend and Crew, LLP

(57) ABSTRACT

A dynamic random access memory (DRAM) integrated circuit (10). The DRAM (10) includes a recessed region (20) defined in a semiconductor substrate (22). This recessed region has substantially vertical sides (34) extending from a bottom surface (32). A field effect transistor (18) is defined adjacent to the recessed region (20). A capacitor structure, including a lower capacitor plate (26), a capacitor dielectric (28), and an upper capacitor plate (30), is defined in the recessed region (20) and over the field effect transistor (18), thereby providing a greater capacitor surface.

7 Claims, 8 Drawing Sheets

| CAPACITOR STRUCTURE | BIT-LINE STRUCTURE |
|---|---|
|  |  |

CAPACITOR STRUCTURE

BIT-LINE STRUCTURE

HIGH DENSITY MEMORY STRUCTURE

CROSS REFERENCE TO RELATED APPLICATIONS

This application is a divisional patent application of U.S. Ser. No. 08/598,258 filed Feb. 7, 1996, U.S. Pat. No. 5,792,686, which is a nonprovisional application of U.S. provisional patent application Ser. No. 60/001,810, filed Aug. 4, 1995.

BACKGROUND OF THE INVENTION

The present invention relates to the manufacture of semiconductor integrated circuits. More particularly, the invention is illustrated with regard to memory cell structures for a dynamic random access memory (DRAM) device, but it will be recognized that the invention has a wider range of applicability. Merely by way of example, the invention may be applied in the manufacture of other semiconductor devices such as application specific integrated circuits (ASICs), microprocessors (MICROs), other memory devices, and the like.

In the fabrication of DRAM devices, memory storage capacity of each DRAM cell has long been a problem. In a DRAM cell, storage capacity is the greatest amount of electrical charge that can be stored in a dielectric material between a lower capacitor electrode and an upper capacitor electrode. This storage capacity is proportional to the surface area of the capacitor dielectric between these capacitor electrodes. Accordingly, a larger capacitor surface area corresponds to increased storage capacity.

Lower density DRAM cells used in 256 kbit DRAM designs relied upon planar capacitor structures, which were built roughly in the same horizontal spatial plane as the transistor gate electrodes. These capacitor structures were formed overlying transistor source/drain regions in the limited spatial region between the transistor gate electrode and the field oxide isolation region. These planar capacitor structures were effective in providing enough storage capacity for these lower density DRAM cells. As DRAM cell sizes became smaller for higher density devices, however, it was increasingly difficult to design a capacitor structure with enough storage capacity within this smaller cell size.

One technique used to improve memory storage capacity for these higher density DRAM cells is a stack capacitor. The stack capacitor forms its capacitor structure "over" the gate electrode of the field effect transistor, rather than being in the same spatial plane as the gate electrode. Therefore, the stack capacitor increases its capacitor surface area by fabrication of the capacitor structure over the gate electrode. A limitation with this capacitor type is, however, difficulty in processing. In fact, the stack capacitor creates a DRAM cell structure with an extremely complicated topography. This extremely complicated topography creates difficult fabrication techniques, rendering longer fabrication turn-around-times, lower device yields, and higher device costs.

Another technique proposed to improve memory storage capacity for higher density DRAM cells is a trench capacitor. The trench capacitor forms its structure within a recessed region or "trench" in the well region of the DRAM cell. This trench is defined by a selected width and depth. The trench also includes a trench side, defining the lower capacitor electrode. Overlying the trench side is the capacitor dielectric layer. A conductive fill material overlying this capacitor dielectric layer defines the upper capacitor electrode. Increased capacitor storage occurs with a greater capacitor surface area.

Greater capacitor surface area correlates to a trench design that is spatially deeper or wider. The trench width can not be substantially enlarged due to the limited amount of substrate surface area for each memory cell. Thus, the trench must be enlarged by fabrication of the deeper trench. This deeper trench, however, is often difficult to fabricate accurately due to its high aspect ratio. Another limitation is the possible presence of "soft error" problems due to the relatively large junction area associated with this trench design. A further limitation is sidewall doping used for the lower capacitor electrode often affects the quality of the capacitor dielectric layer.

From the above it is seen that a high density memory cell structure that is easy to fabricate, cost effective, and reliable is often desired.

SUMMARY OF THE INVENTION

The present invention provides a technique, including a method and structure, for an improved capacitor for a DRAM integrated circuit device. This improved capacitor is provided with a larger surface area without the formation of deeper trenches.

In a specific embodiment, the present invention provides a dynamic random access memory (DRAM) integrated circuit. This DRAM integrated circuit includes a semiconductor substrate comprising a recessed region. The recessed region has vertical sides extending from a bottom surface. A field effect transistor, including a source/drain region, is provided adjacent to the recessed region. The DRAM integrated circuit also includes an insulating layer overlying the recessed region. A lower capacitor plate overlying the insulating layer and over a portion of the field effect transistor is also provided. This lower capacitor plate is connected to the source/drain region. The DRAM integrated circuit further includes a capacitor dielectric overlying the lower capacitor plate, and an upper capacitor plate overlying the dielectric layer. The lower capacitor plate, capacitor dielectric, and upper capacitor plate define the capacitor structure.

In an alternative embodiment, a method of forming a capacitor structure for a dynamic random access memory integrated circuit element is provided. This method includes providing a semiconductor substrate, and forming a recessed region in the substrate. This recessed region has vertical sides extending from a bottom surface. The method also includes forming an insulating layer defined overlying the recessed region. A further step of forming a source/drain region adjacent to the recessed region is provided. The method includes forming a lower capacitor plate overlying the insulating layer and over a portion of the field effect transistor. This lower capacitor plate is connected to the source/drain region. The method also includes forming a capacitor dielectric overlying the lower capacitor plate, and forming an upper capacitor plate overlying the dielectric layer. The lower capacitor plate, capacitor dielectric, and upper capacitor plate define the capacitor structure.

A further alternative embodiment includes a bit-line structure for a dynamic random access memory integrated circuit. This bit-line structure includes a semiconductor substrate comprising a recessed region. This recessed region has vertical sides extending from a bottom surface. A field effect transistor is defined adjacent to the recessed region. An insulating layer is defined overlying the recessed region, and a conductor is defined within the recessed region. This conductor connects to the source/drain region, and defines a bit-line.

An alternative specific embodiment includes a method of forming a bit-line structure in a dynamic random access memory integrated circuit. This method includes providing a semiconductor substrate, and forming a recessed region in the semiconductor substrate. This recessed region has vertical sides extending from a bottom surface. The method also includes a step of forming an insulating layer defined overlying the recessed region, and forming a field effect transistor adjacent to the recessed region. A conductor is defined within the recessed region. This conductor connects to the source/drain region, and defines a bit-line.

The present invention achieves these benefits in the context of known process technology. However, a further understanding of the nature and advantages of the present invention may be realized by reference to the latter portions of the specification and attached drawings.

DESCRIPTION OF THE SPECIFIC EMBODIMENT

I. Dram Device Structures

Figure 1:
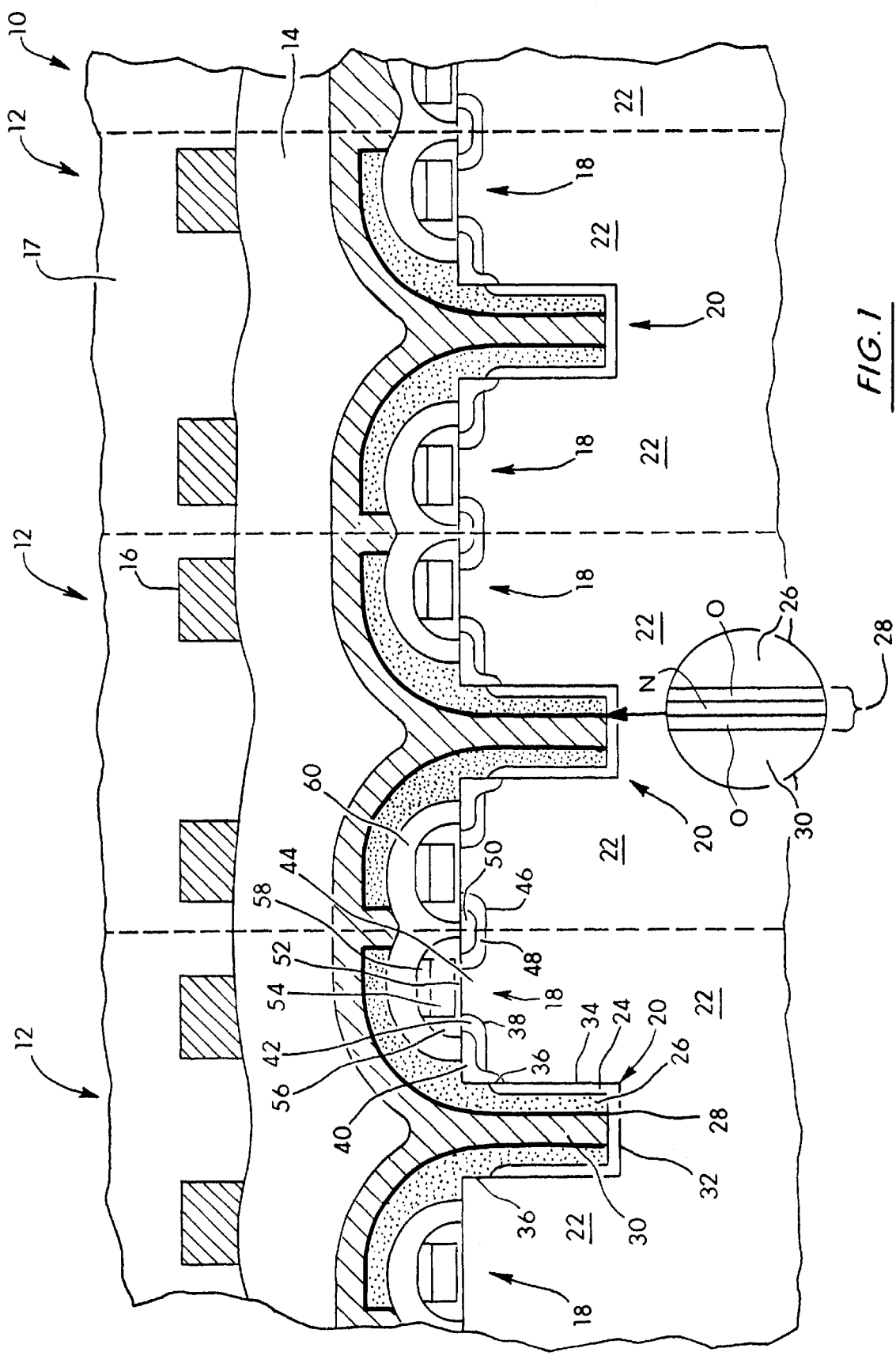
FIG. 1 is a simplified cross-sectional view diagram of a DRAM integrated circuit device according to the present invention.

FIG. 1 is a simplified cross-sectional view diagram of a DRAM integrated circuit device 10, according to the present invention. The present device is merely an illustration and should not limit the scope of the claims as defined herein. Generally, the DRAM device 10 includes a plurality of memory cell regions 12, an overlying dielectric layer 14, a top metallization layer 16, a passivation layer 17, and other elements. The memory cell regions can be fabricated using conventional CMOS processing techniques or the like.

Each memory cell region 12 is defined within a P-type well region 22. A field effect transistor 18 is defined within this P-type well region 22. The field effect transistor is an N-type channel metal oxide semiconductor (MOS) device, including a gate electrode 54. The gate electrode 54, termed as the word line, overlies a thin gate dielectric layer(s) 52. Sidewalls 56 are defined adjacent to sides of the gate electrode 54. Overlying the gate electrode 54 is a cap oxide layer 58. An inter-layer dielectric 60 is formed overlying the cap oxide layer 58 and also is formed overlying portions of source/drain regions 38, 46. Each source/drain region includes an N− type LDD region 42, 48 and an N+ type source/drain region 40, 50. As shown, N+ type source/drain region 40 is connected to a trench capacitor 20, also defined within the P-type well region 22.

This trench capacitor serves as a memory storage device for storing electrical charge in a capacitor dielectric 28 between a lower capacitor plate 26 and an upper capacitor plate 28. This capacitor dielectric can be any suitable insulating material such as silicon dioxide, silicon nitride, and others. Preferably, the capacitor dielectric is a sandwiched layer comprising silicon dioxide, silicon nitride, and silicon dioxide, known as oxide-on-nitride-on-oxide (ONO). Of course, other combinations of dielectric materials also can be used depending upon the application.

The lower capacitor plate 26 is defined over the field effect transistor 18 and is defined overlying an insulating layer 24, overlying the trench bottom 32 and sides 34. This insulating layer is at a selected thickness sufficient for isolating the P-type well region from the lower capacitor plate 26. A high quality silicon dioxide material can be used as this insulating layer for isolation purposes. The layer, however, is removed from an upper portion 36 of the trench sides 34, providing an electrical contact between the lower capacitor plate 26 and the N+ type source/drain region 40.

The lower capacitor plate can be any suitable conductive layer. Preferably, the lower capacitor plate is a polysilicon layer in-situ doped using N-type impurities, e.g., phosphorous, etc. The lower capacitor plate can also be made from a sandwiched structure, including multi-metal layers, silicides, combinations thereof, and the like. In another embodiment, the lower capacitor plate is made using a textured or rough polysilicon layer. This textured polysilicon layer, unlike smooth polysilicon, has small ridges, thereby increasing the effective surface area of the capacitor. As shown, the lower capacitor plate extends from the insulating layer on the trench bottom 32, overlies the insulating layer on the trench sides 34, contacts the source/drain region 40, and extends over the inter-layer dielectric 60, overlying the field effect transistor 18.

The upper capacitor plate 30 is defined overlying the capacitor dielectric 28. This upper capacitor plate extends from the trench insulating layer bottom 32 and extends overlying the capacitor dielectric layer, which overlies the lower capacitor plate. Preferably, the upper capacitor plate also is made from an in-situ doped polysilicon material using N-type impurities. Alternatively, the upper capacitor plate can also be made from a sandwiched structure, including multi-metal layers, silicides, combinations thereof, and the like. Another embodiment uses an upper capacitor plate made of a textured or rough polysilicon layer. This textured polysilicon layer, unlike smooth polysilicon, has small ridges, thereby increasing the effective surface area of the capacitor.

As can be seen, the present trench capacitor structure, including the lower capacitor plate 26, the capacitor dielectric 28, and the upper capacitor plate 30, extends from the trench bottom 32, extends along its sides 34, and extends over the field effect transistor 18. Accordingly, this trench capacitor structure can be made substantially longer than the conventional capacitor structures.

The present trench capacitor is designed to provide increased capacitance without the undesirable characteristics of the conventional trench structure, which is often difficult to fabricate consistently beyond a certain depth. Using a 0.25 µm design rule, as an example, the trench depth ranges from about 8,000 to about 12,000 Å, and preferably about 10,000 Å. The trench also includes a 2,500 Å width for bit-line and isolation area. The trench width for the capacitor is around the 4,000 Å range. This trench structure provides a lower capacitor plate. The thicknesses of this capacitor plate ranges from about 1,000 to about 1,400 Å, and preferably about 1,200 Å. As noted, a portion of the lower capacitor plate is defined overlying the field effect transistor as well as the trench side.

Figure 2:
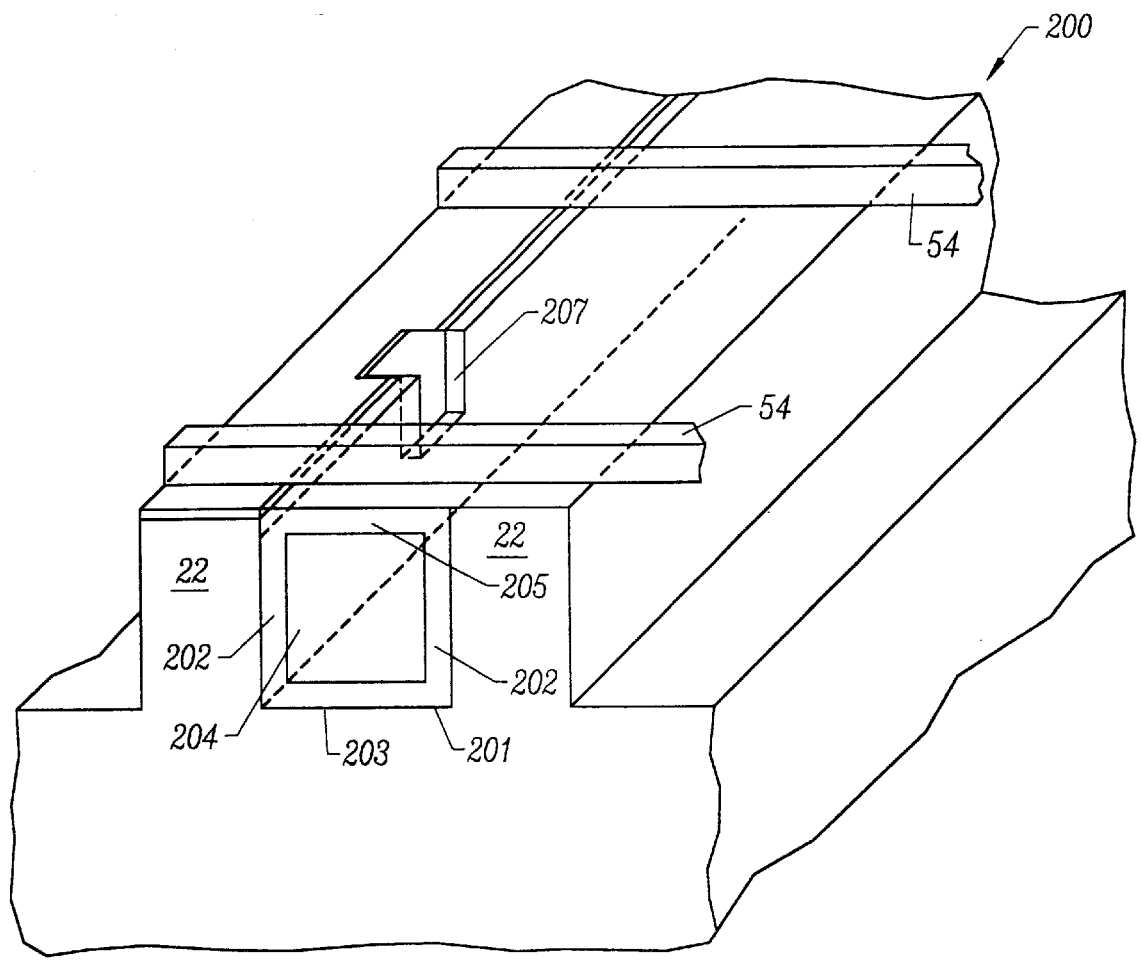
FIG. 2 is a simplified cross-sectional view diagram of a bit-line structure for the DRAM of FIG. 1.

FIG. 2 is a simplified cross-sectional view diagram 200 of a bit-line structure for the DRAM device of FIG. 1. The present bit-line structure is merely an illustration, and should not limited the claims as defined herein. The cross-sectional view diagram 200 includes the P-type well region 22 and the gate electrode 54 (or word line). A bit-line 204 is formed in a trench 201, having sides and a bottom. This trench has an insulating layer, including a bottom insulating layer portion 203 and a side insulating layer portion 202, overlying its periphery.

This insulating layer isolates the bit-line from the P-type well region 22. As shown, the bit-line is formed perpendicular to the word line(s) 54, and provides a connection to each of the transistor source/drain regions adjacent to the bit-line.

In particular, the bit-line connects to the source/drain region(s) 46 of the field effect transistor(s) 18. This connection occurs through a contact opening 207 in the side insulating layer portion 202. That is, a portion of the side insulating layer is removed before bit-line formation and forms the contact opening used for contacting the source/drain region(s) 46 to the bit-line 204. Using a 0.25 $\mu$m design rule, the contact opening width ranges from about 2,000 to about 2,800 Å, and is preferably about 2,200 Å. A depth of such contact opening ranges from about 2,200 to about 2,800 Å, and is preferably about 2,500 Å.

The bit-line is made of a conductive material. Preferably, the bit-line is a polysilicon layer in-situ doped with N-type impurities, e.g., phosphorous, etc. Alternatively, the bit-line can be made by depositing the polysilicon layer and heavily doping with $POCl_3$ diffusion or ion implantation with annealing. The bit-line is confined in the trench width and trench depth. Corresponding to the bit-line thickness is a trench depth, which has about a 1,000 Å top insulating portion and about a 500 Å bottom insulating portion. Of course, the bit-line also may be made of other materials such as polycide or combination of materials using different dimensions.

Overlying the bit-line is a top insulating layer portion 205. This top insulating portion 205 isolates the bit-line from overlying device elements such as the gate electrode and others. Preferably, the insulating layer portions, including the top insulating layer portion 205, the side insulating layers portion 202, and bottom insulating layer portion 203, are defined around the periphery of the bit-line to generally isolate it from the P-type well region and other device elements, defined around the trench periphery. As shown, the top insulating layer 205 connects to the side insulating layer portions 202, which connect to the bottom insulating layer 203 portion.

Figure 3:
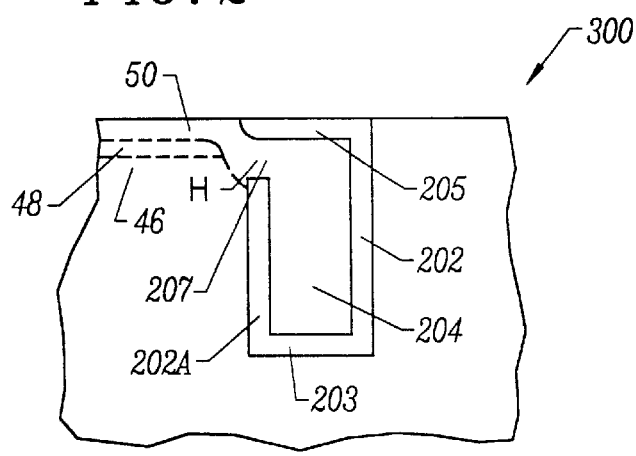
FIG. 3 is an alternative cross-sectional view diagram of the bit-line structure of FIG. 2.

FIG. 3 is an alternative cross-sectional view diagram 300 of the bit-line structure of FIG. 2. This cross-sectional view diagram illustrates the connection between the bit-line 204 and the source/drain region 46 through the contact opening 207. As shown, the opening 207 allows the bit-line 204 to connect to the N+ type source/drain region 50. This N+ type source/drain region provides lower resistance than its adjacent N− type LDD region, and therefore facilitates the transfer of charge representing a signal from the source/drain region 46 of the memory cell to the bit-line 204. Preferably, the connection between the bit-line 204 and source/drain region 46 occurs at this N+ type source/drain region 50.

Adjacent to the contact opening 207 is the top insulating layer portion 205 and the side insulating layer portion 202A. This top insulating layer portion 205 and side insulating layer portion 202A are connected to the side insulating layer portion 202 and the bottom insulating layer portion, respectively, which are connected to each other. This combination of insulating layer portions isolates the bit-line 204 from adjacent device elements, but connects the bit-line to the transistor source/drain region 46. Each DRAM memory cell has such a bit-line connection.

Figure 4:
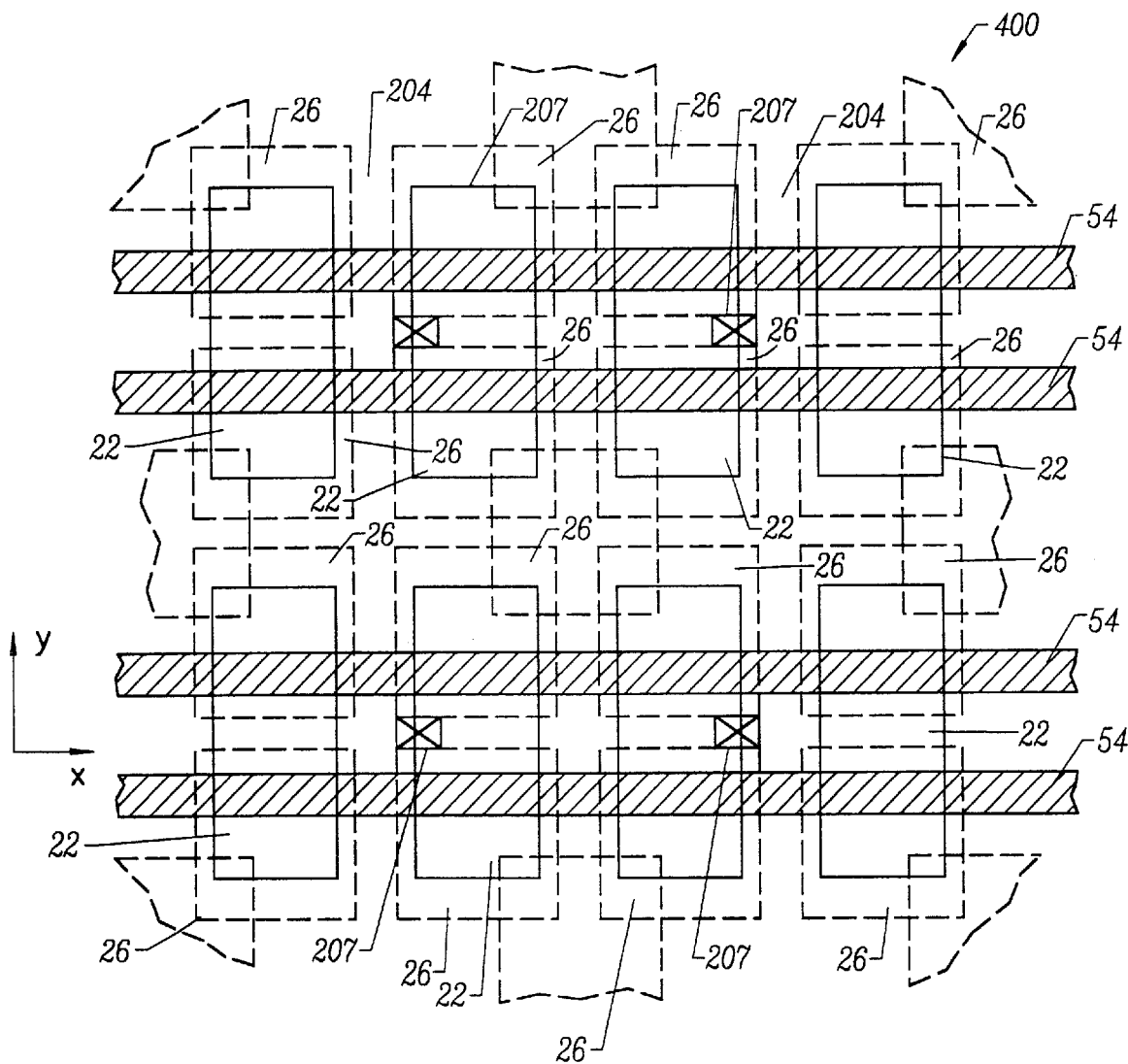
FIG. 4 is a simplified top-view diagram of the DRAM of FIG. 1.

FIG. 4 is a simplified top-view diagram 400 of the present DRAM integrated circuit structure. This top-view diagram is merely an illustration, and should not limit the claims as defined herein. The top-view diagram is defined as an array having a y-direction and an x-direction. Gate electrodes 54 run in the x-direction, and are defined overlying the P-type well regions 26. Each lower capacitor electrode 26, defined lengthwise in the y-direction, is formed over the gate electrode 54. A plurality of bit-lines 204 run underlying the gate electrodes 54 in the y-direction, and perpendicular to the gate electrodes 54. Each bit-line includes a plurality of contacts 207, connecting the bit line to its respective source/drain region of the field effect transistor.

II. Dram Fabrication Techniques

An overall fabrication method according to the present invention may be briefly outlined as follows.

(1) Provide a semiconductor substrate.

(2) Mask 1: Form P-type wells within the semiconductor substrate.

(3) Mask 2: Form N-type wells within the semiconductor substrate.

(4) Form protective layer comprising a pad oxide layer and a silicon nitride layer.

(5) Mask 3: Pattern active area to define trench regions.

(6) Form trench regions.

(7) Form trench sidewall and bottom oxidation.

(8) Mask 4: Define bit-line contact, and strip photoresist.

(9) Deposit in-situ doped polysilicon to fill trench regions.

(10) Etch back in-situ doped polysilicon maintaining in-situ doped polysilicon within the trench.

(11) Mask 5: Define non-bit-line trench regions, and remove in-situ doped polysilicon in the non-bit-line trench regions.

(12) Oxidize in-situ doped polysilicon in bit-line trench regions.

(13) Mask 6: Mask P-type channel regions and implant channel stop regions up to the trench bottoms.

(14) Deposit borophosphosilicate glass (BPSG) to fill the trench regions in the non-bit-line trench regions.

(15) Remove the protective layer from the active regions.

(16) Perform blanket threshold implant.

(17) Mask 7: Mask N-type well regions and implant P-type impurities into the memory cell regions (or P-type well regions) to adjustment threshold voltage.

(18) Form gate oxide layer.

(19) Form doped gate polysilicon layer or polycide (or poly-1).

(20) Mask 8: Define gate polysilicon layer to form gate electrodes.

(21) Mask 9: Define N− type lightly doped drain (LDD) regions and implant N− type impurities.

(22) Mask 10: Define P− type LDD region and implant P− type impurities.

(23) Form sidewall spacers on sides of the polysilicon gate electrodes.

(24) Mask 11: Define N+ type source/drain regions and implant N+ type impurities.

(25) Mask 12: Define P+ type source/drain regions and implant P+type impurities.

(26) Mask 12: Define capacitor regions covering bit-line regions and word-line regions with photoresist.

(27) Remove BPSG in the trench capacitor regions, and strip photoresist.

(28) Deposit inter polysilicon oxide layer.

(29) Mask 14: Define capacitor cell contact regions and etch.
(30) Deposit poly-2 layer and dope.
(31) Mask 15: Define poly-2 layer to correspond to a lower capacitor electrode.
(32) Form cell capacitor dielectric.
(33) Deposit poly-3 layer and dope (or in-situ doped poly-3 deposition).
(34) Mask 16: Define poly-3 layer to correspond to an upper capacitor electrode.
(35) Deposit BPSG/NSG (non-doped silicate glass) layers, and flow.
(36) Mask 17: Define contact pattern in the BPSG/NSG layers.
(37) Sputter first metal layer.
(38) Mask 18: Define first metal layer.
(39) Deposit inter-metal oxide.
(40) Mask 19: Define via pattern.
(41) Sputter second metal layer.
(42) Mask 20: Define second metal layer.
(43) Deposit passivation layer and polymide coating.
(44) Mask 21: Define pad regions and fuse opening regions.
(45) Polymide cure.
(46) Etch passivation layer to define pads.
(47) Sintering.

These steps provide an improved capacitor having a shallow trench and stack capacitor plate. Each of these capacitor plates is defined in the trench and over portions of the gate electrode of the field effect transistor. Accordingly, a larger capacitor surface area is achieved, thereby improving storage capacity. A bit-line structure defined in a trench also is provided. This bit-line structure connects to respective source/drain regions, without employing the complex topography of the conventional techniques. These steps are also merely illustrative, and should not limited the scope of the claims. Details of the present method are described by way of the Figs. below.

Figure 5:
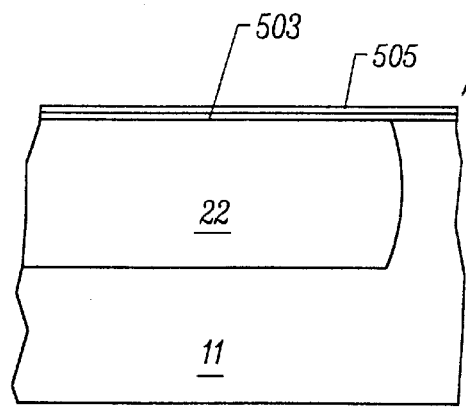
FIGS. 5–14 illustrate a simplified fabrication method of a DRAM integrated circuit device according to the present invention.
Figure 5:
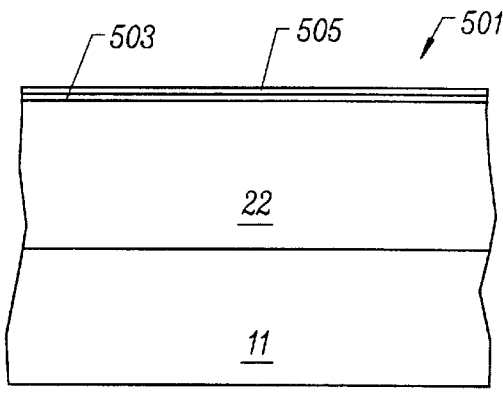

FIGS. 5–14 illustrates a simplified fabrication method of a DRAM integrated circuit device, according to the present invention. The present method is merely an illustration, and should not limit the scope of the claims herein. The method begins by providing a semiconductor substrate 11, as illustrated by FIG. 5. The substrate can be any suitable wafer for the fabrication of the present integrated circuit device. This wafer undertakes, for example, complementary metal oxide semiconductor (CMOS) device fabrication techniques for DRAM devices. Other fabrication techniques also can be used depending upon the particular application.

A photoresist mask is defined overlying a top surface of the semiconductor substrate to form P-type well regions 22. These P-type well regions 22 are formed by implanting impurities comprising P-type materials into the substrate. P-type impurities include boron or the like. The photoresist mask is stripped by conventional techniques. N-type channel devices now can be formed in the P-type well regions.

N-type wells also are defined within the semiconductor substrate. In particular, a photoresist mask is formed overlying the P-type well regions of the semiconductor substrate. An implanting step forms the N-type well regions in the semiconductor substrate. N-type impurities comprise materials such as phosphorous, arsenic, and others. The photoresist mask is stripped by conventional techniques. P-type channel devices now can be formed in the N-type well regions.

Figure 6:
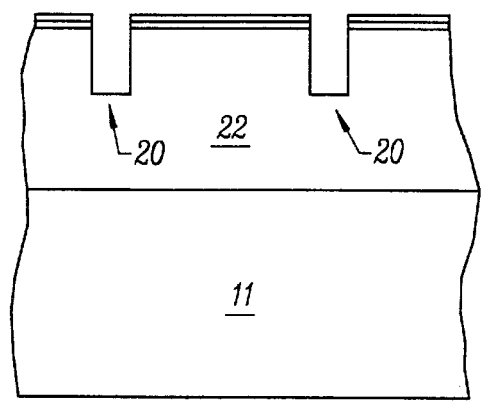
Figure 6:
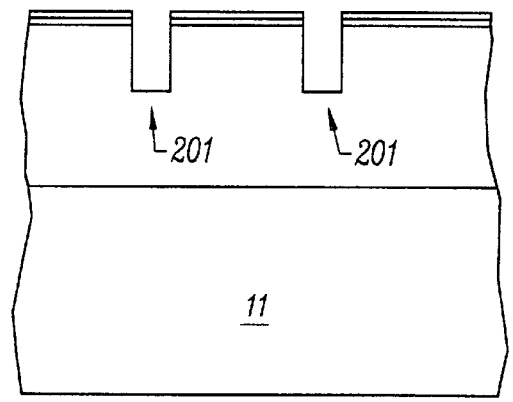

A combination of dielectric layers 501 is defined overlying the substrate to form a protective layer, as illustrated by FIG. 5. That is, the protective layer is used as a masking layer. This protective layer comprises a pad oxide layer 503 and an overlying silicon nitride layer 505. The pad oxide layer is 200 to 300 Å thick. The silicon nitride layer is 1,200 to 1,800 Å thick. Optionally, the silicon nitride layer 505 includes another overlying silicon dioxide layer (not shown). These layers are patterned to define a plurality of trench regions, including a capacitor trench 20 and a bit-line trench 201, as illustrated by FIG. 6.

A dry etching technique is used to form the capacitor trench 20 and the bit-line trench 201. An example of this dry etching technique can include reactive ion etching, plasma etching, or the like. Preferably, the trench is relatively shallow compared to those conventional deep trenches for capacitors, and is therefore easier to fabricate consistently. Using a 0.25 $\mu$m design rule, the capacitor trench depth ranges from about 0.8 to about 1.2 $\mu$m, and is preferably about 1.0 $\mu$m. The trench also includes a 0.4 $\mu$m width. Using the same design rule, the bit-line trench depth can be similar to the capacitor trench and ranges from about 0.8 to about 1.2 $\mu$m, and is preferably about 1.0 $\mu$m. This trench also is 0.25 $\mu$m wide. Of course, the depth and width of each trench depend upon the application.

Figure 7:
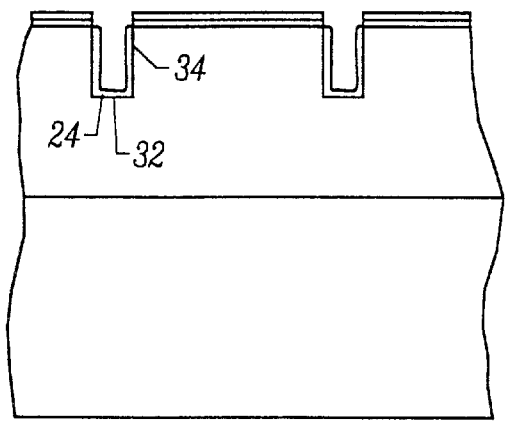
Figure 7:
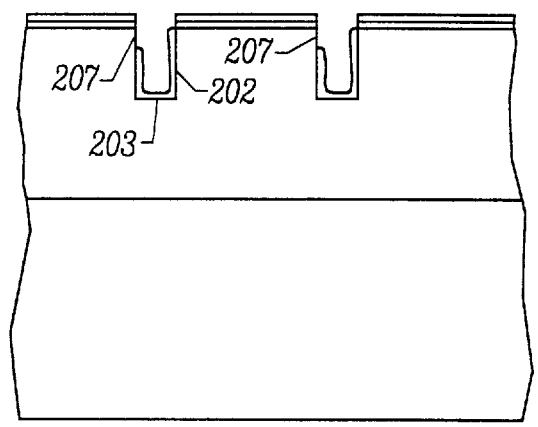

A layer of dielectric isolation material is defined in each of the trenches, including the capacitor trench 20 and the bit-line trench 201, as illustrated by FIG. 7. In particular, the capacitor trench 20 includes a dielectric layer 24 overlying the trench bottom 32 and trench sides 34. The bit-line trench 201 has a side dielectric layer portion 202 and a bottom dielectric layer portion 203, overlying the trench sides and bottom, respectively. These trenches are preferably covered with an oxidation layer via thermal oxidation of silicon. This oxidation layer has a sufficient thickness to isolate its overlying structure from the substrate and other device elements. Preferably, the oxidation layer includes a thickness ranging from about 400 to about 600 Å, and is preferably about 500 Å. The trench also may be coated with an oxide layer or multiple dielectric layers, deposited by chemical vapor deposition (CVD) or other suitable techniques. Of course, the dielectric material(s) and its thickness depend upon the application.

Masking and etching techniques are used to define bit-line contacts in the dielectric layer formed in the bit-line trenches. These bit-line contacts are defined as openings 207 in the dielectric layer, overlying the trench sides. In an embodiment using an oxide dielectric layer, openings are made by coating the top surface of the substrate, including trenches, with a photoresist layer. Coating is followed by steps of patterning the photoresist to form exposed regions overlying contacts, and wet etching the exposed regions to form the bit-line contact openings. Each of these bit-line contact openings is 0.25 $\mu$m wide, and is 3,000 Å deep. The photoresist is then stripped using conventional techniques. During later process steps, the contact opening provides a via structure to connect the bit-line to a source/drain region of each respective field effect transistor.

Figure 8:
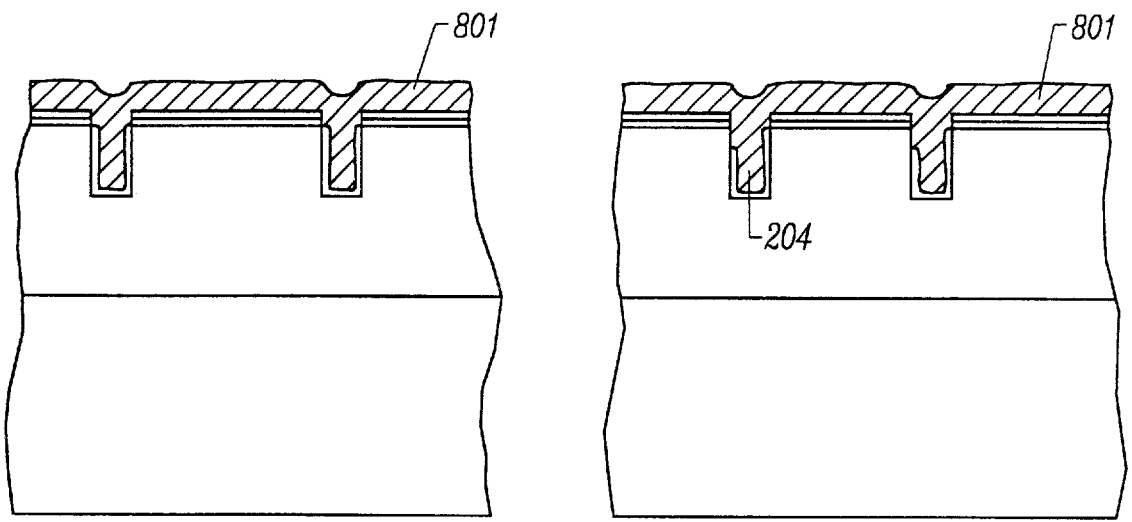

These trenches are now filled using an in-situ doped polysilicon fill layer 801, as illustrated by FIG. 8. The in-situ doped polysilicon layer is heavily doped to provide a selected conductivity. This doping is preferably N-type, using phosphorus for example, and is at a concentration ranging from about $2 \times 10^{20}$ to about $6 \times 10^{20}$ atoms/cm$^3$, and is preferably $4 \times 10^{20}$ atoms/cm$^3$. In the bit-line trench, the doped polysilicon layer fills the contact opening and forms overlying against the surface of the substrate. This substrate surface will correspond to a source/drain region of the field effect transistor.

An etching step removes an upper portion of the in-situ doped polysilicon layer. This etching step also removes some of the in-situ doped polysilicon layer in the trenches. Preferably, the top surface of the polysilicon is about 1,000 Å from the top surface of the silicon substrate. Examples of this etching step include plasma etching, reactive ion etching, and others.

The in-situ doped polysilicon is removed from non-bit-line-trench areas. That is, the in-situ doped polysilicon is removed from the capacitor trenches, but not the bit-line trenches. In an embodiment, this removal of the doped polysilicon occurs by coating the top surface of the substrate with photoresist and exposing regions overlying the capacitor trenches. A subsequent etching step removes the doped polysilicon layer from these capacitor trenches.

Figure 9:
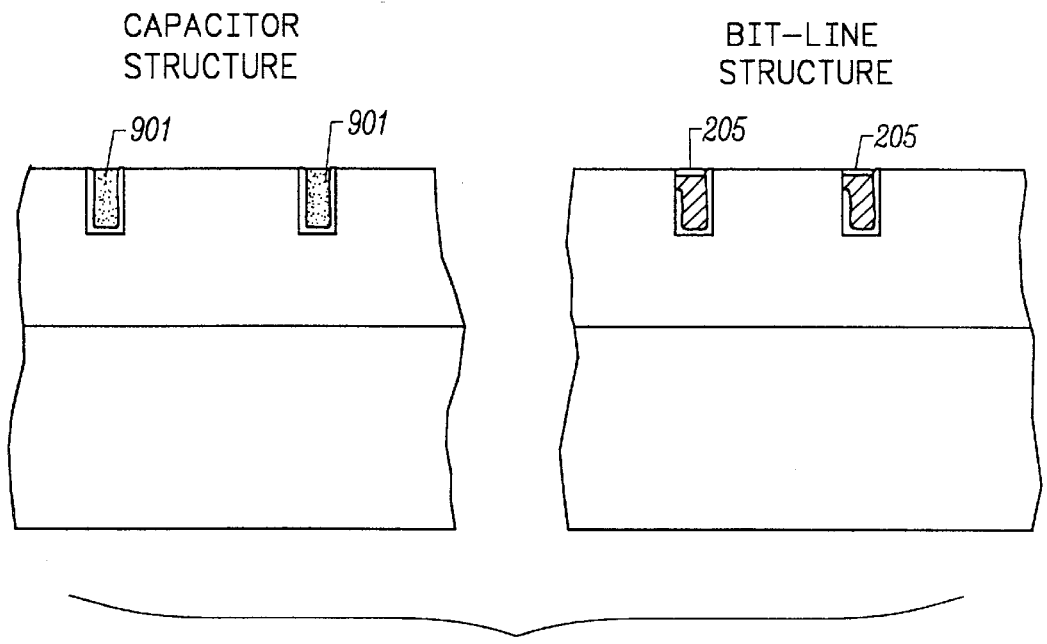

Upon removing the in-situ doped polysilicon, each capacitor trench is now open, leaving its insulating layer intact. The capacitor trench is filled using a filler material. This filler material should be easy to apply, provide good masking characteristics, and can be selectively removed during a later processing step. In one embodiment, BPSG 901 fills these trenches, as illustrated by FIG. 9. Of course, other materials also can be used depending upon the application.

An upper portion 205 of the in-situ doped polysilicon in the bit-line trench is oxidized via thermal treatment, also illustrated by FIG. 9. This polysilicon layer is exposed to high temperature and an oxidizing compound, e.g., oxygen, water, etc. Thermal treatment of the in-situ doped layer converts the polysilicon into a silicon dioxide layer having insulating qualities. This silicon dioxide layer includes a thickness ranging from about 400 to about 600 Å, and is preferably about 500 Å. This thickness must be sufficient to isolate the bit-line from its overlying device elements. Of course, other techniques (e.g., CVD, etc.) also may be used to form this silicon dioxide layer.

Channel stop regions are then formed in the substrate. In one embodiment, steps of masking P-type channel regions and implanting channel stop regions are performed. Preferably, implanting occurs to a depth corresponding to the trench bottoms. The channel stop implant uses an N-type implant, e.g., phosphorous, etc.

The protective layer is removed from the active regions, as further illustrated by FIG. 9. This protective layer comprises silicon dioxide and silicon nitride. The silicon nitride layer can be removed using a dry etching technique or wet etching, e.g., phosphoric acid, etc. The silicon dioxide layer overlying the substrate must be selectively removed, thereby preventing damage to the substrate. In one embodiment, the silicon dioxide is selectively removed using a solution of hydrofluoric acid or the like. Of course, other techniques may be used depending upon the application.

N-type channel MOS devices and P-type channel PMOS devices, typifying the CMOS process, will be formed onto the P-type well regions and N-type well regions, respectively. DRAM memory cells are defined into the P-type well regions. Fabrication of these devices occurs using these following steps.

An implanting step introduces a threshold implant overlying the entire surface of the substrate. This implant blanketly introduces N-type impurities overlying both the P-type and the N-type well regions. In one embodiment, the N-type impurities comprise phosphorous, arsenic, or the like.

A photoresist mask is defined overlying N-type well regions for implanting P-type impurities, e.g., boron, etc. This P-type implanting step sets the threshold voltage of the N-type channel devices in each of the memory cells. The implant depends upon gate oxide thickness. Alternatively, P-type impurities are implanted before N-type impurities.

Figure 10:
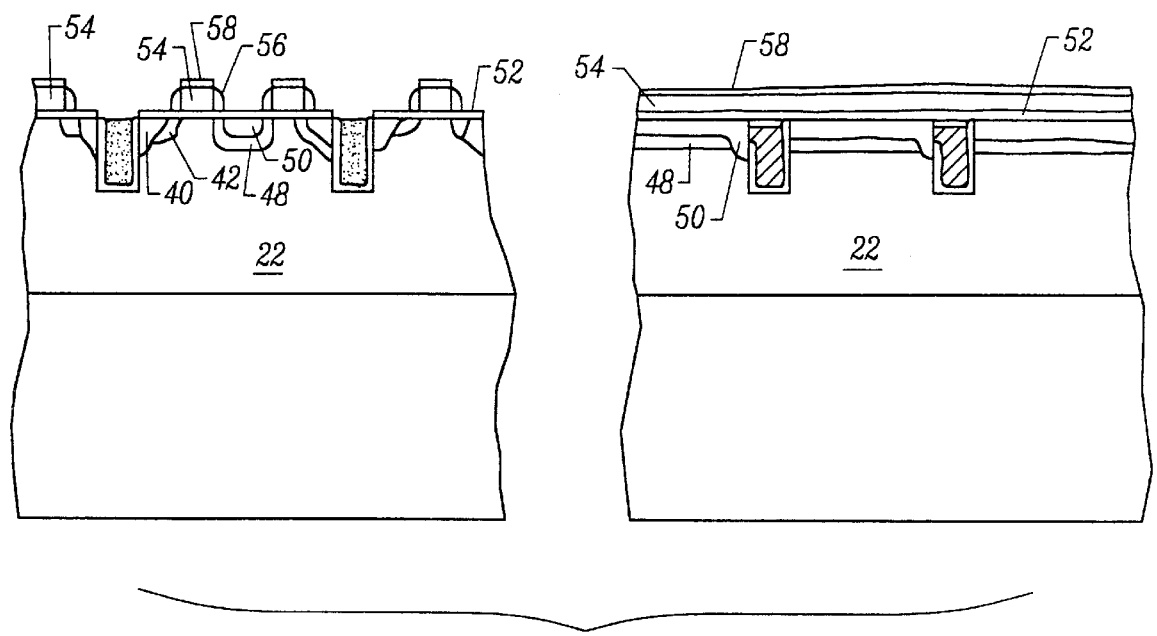

A gate oxide layer 52 is formed overlying the top surface of the P-type well regions, as illustrated by FIG. 10. This gate oxide layer is a high quality oxide, and is also typically thin to promote for efficient switching of the device. The thickness of such a gate oxide layer typically ranges from about 90 Å to about 110 Å, and is preferably about 100 Å.

A deposition step forms a polysilicon layer overlying the oxide layer. The polysilicon layer or polycide (WSix on top of poly) ranges from about 2,500 to about 3,500 Å thick, and is preferably about 3,000 Å thick. The polysilicon layer is also typically doped with an N-type impurity at a concentration of from about $4\times10^{20}$ to $6\times10^{20}$ atoms/cm$^3$, and preferably at about $5\times10^{10}$ atoms/cm$^3$. A step of implanting and annealing provides the N-type impurities into the polysilicon layer. Alternatively, the N-type impurities are diffused or formed in-situ with the polysilicon layer to reduce the number of processing steps for the polycide gate embodiment, a thinner poly around 1,500 Å is applied and doped followed by about 1,000 Å WSi$_x$ deposition.

Patterning the polysilicon layer or polycide defines the polysilicon gate electrodes 54, as illustrated by FIG. 10. These gate electrodes, termed as word lines, are often formed by any suitable series of photolithographic steps including masking, developing, etching, and others. Each gate electrode includes edges having substantially vertical features, but may also have features that are not substantially vertical. The exact geometry for each gate electrode will depend upon the application.

Using each gate electrode as a mask, a blanket implant process introduces N– type impurities into a portion of the wells to define the N– type LDD regions 42, 48 in the P-type wells 22. The N-type impurity dosage ranges from about $1\times10^{13}$ to about $5\times10^{13}$ atoms/cm$^2$, and is preferably at about $3\times10^{13}$ atoms/cm$^2$. The angle at which the implant takes place ranges from angles greater than about 0 degree, and is preferably about 30 degrees to about 45 degrees from a line perpendicular to the channel direction. Alternatively, N-type well regions are masked and N-type implants are made into the P-type well regions, defining the N-type LDD regions. This sequence of steps defines the N-type LDD region in the memory cells.

P-type well regions are masked and P– type impurities are introduced into the N-type well regions. These implants define the P– type LDD regions in the N-type well regions. P– type LDD regions include a dosage ranging from about $1\times10^{13}$ to about $5\times10^{13}$ atoms/cm$^2$, and are preferably at about $3\times10^{13}$ atoms/cm$^2$. The P– type LDD regions may also be angle implanted depending upon the application.

Sidewall spacers 56 are defined on edges of each polysilicon gate electrode 54. The sidewall spacers 56 are typically formed by the steps of depositing a layer of dielectric material, densifying such layer, and removing horizontal surfaces of such layer. This layer is made of a material such as a silicon dioxide, a silicon nitride, combinations thereof, and the like. The step of densifying such dielectric material seals the polysilicon gate electrode 54 from overlying layers, e.g., a dielectric material such as silicon dioxide, silicon nitride, combinations thereof, and the like. Anisotropic etching performed on the densified dielectric layer removes horizontal surfaces of such layer, forming the sidewall spacers. The anisotropic etching step removes the horizontal surfaces of the dielectric material and leaves the sidewall spacers remaining intact. This anisotropic etching step includes techniques such as reactive ion etching, plasma etching, and others.

Masking and implanting steps define source/drain regions for each MOS device. In particular, a photoresist mask is used to protect regions defining P-type channel devices, thereby exposing source/drain regions for the N-type channel devices. Implanting N+ type impurities into these exposed regions defines the N+ type source/drain regions 40, 50, as also illustrated by FIG. 10. These impurities include phosphorous and the like. The dosage of the N+ type impurities ranges from about $3 \times 10^{15}$ atoms/cm$^2$ to about $5 \times 10^{15}$ atoms/cm$^2$, and is preferably about $4 \times 10^{15}$ atoms/cm$^2$. The angle at which the implant takes place ranges from about 0 degrees to about 7 degrees, and is preferably at about 0 degrees from a line perpendicular to the channel direction. The photoresist mask is stripped by conventional techniques.

Another photoresist mask now protects the N-type channel devices, and exposes the source/drain regions for the P-type channel devices. P+ type impurities are introduced into the source/drain regions of the P-type channel devices. The dosage of the P+ type impurities ranges from about $3 \times 10^{15}$ to about $5 \times 10^{15}$ atoms/cm$^2$, and is preferably about $4 \times 10^{15}$ atoms/cm$^2$. The photoresist mask is then stripped using conventional techniques.

The top surface of the substrate is then masked to define openings over the trench capacitor regions. That is, a photoresist mask covers the bit-line and the word line. The BPSG 901 is removed from the trench capacitor regions. In one embodiment, a wet etching step using hydrofluoric acid selectively removes the BPSG layer from the trench, leaving the insulating regions 24 remaining intact. Alternatively, dry etching techniques may be used to selectively remove the BPSG layer from the trench. The photoresist mask is stripped using conventional techniques.

Figure 11:
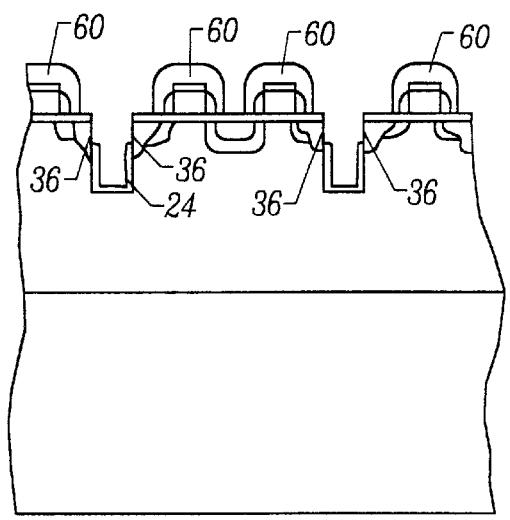
Figure 11:
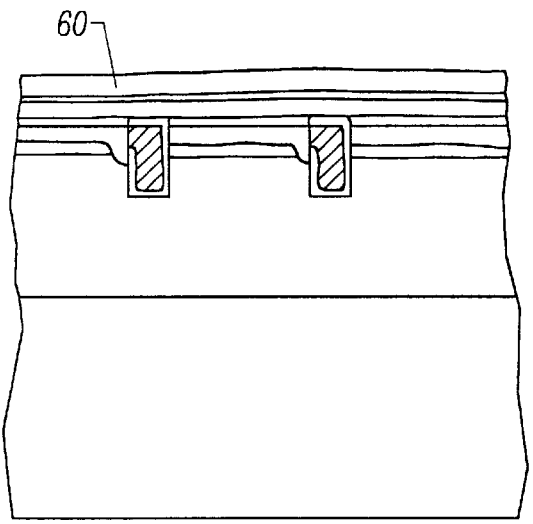

A CVD process forms an inter-layer dielectric 60 overlying the gate electrodes 54, as illustrated by FIG. 11. This inter-layer dielectric can be a suitable material comprising TEOS and others. A technique such as APCVD, PECVD, LPCVD, and the like deposits the inter-layer dielectric, e.g., silicon dioxide, etc. Of course, the technique used depends upon the application.

A step of providing a photoresist mask overlying top surface regions of the substrate, including the capacitor trench, to form exposed regions overlying cell contact regions 36 is performed. These cell contact regions or openings in the isolation regions are defined by etching techniques, as illustrated in FIG. 11. Examples of these etching techniques include plasma etching, reactive ion etching, and others. Alternatively, a wet etching technique using a selective etchant such as hydrofluoric acid may be used. As shown, each opening is provided to connect the lower capacitor electrode to the field effect transistor source/drain region. The opening is about 2,000 Å lower than the surface of the substrate. The top portion of the exposed source/drain regions is substantially free from oxidation before the next process step. A dilute acid dip or dry etching technique may be used to clear the source/drain regions.

This next step deposits a lower capacitor electrode layer overlying the isolation regions and an exposed portion 36 of the source/drain region. The lower capacitor layer also is provided over a top portion 1201 of the inter-layer dielectric 60, thereby further increasing the surface area of the capacitor cell. This increased surface area provides an increase in capacitance. Preferably, the lower capacitor layer is made of polysilicon, which is heavily doped with impurities for reducing resistance. The impurities are introduced using multiple angle implanting techniques or can be in-situ-doped, depending upon the application. In one embodiment, the impurities are N-type, e.g., phosphorous, etc.

Figure 12:
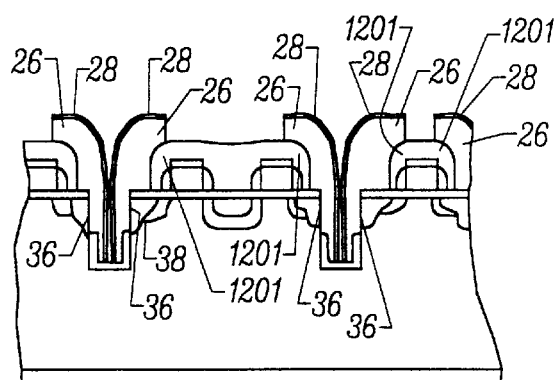
Figure 12:
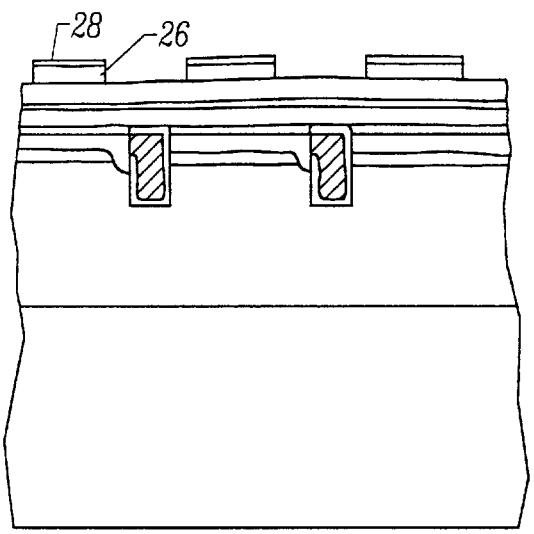

Step of masking and etching define the lower capacitor layer into a lower capacitor electrode plate 26, as illustrated by FIG. 12. This lower capacitor electrode plate connects to the field effect transistor source/drain region 38 through the contact opening 36. The photoresist layer is then stripped using conventional techniques. Before fabrication of an overlying dielectric layer, the lower capacitor layer is cleared using dry etching techniques or the like.

A capacitor dielectric layer(s) 28 is formed overlying the lower capacitor plate. This capacitor dielectric layer is used to store charge between the lower capacitor plate and an upper capacitor plate. In one embodiment, the capacitor dielectric layer is a high quality nitride/oxide composite layer. In a preferred embodiment, the capacitor dielectric layer comprises a silicon dioxide layer overlying the lower capacitor plate, a silicon nitride layer overlying the silicon nitride layer, and another silicon dioxide layer overlying the nitride layer. This combination of layers provides for high storage capacity characteristics and ease in fabrication.

Figure 13:
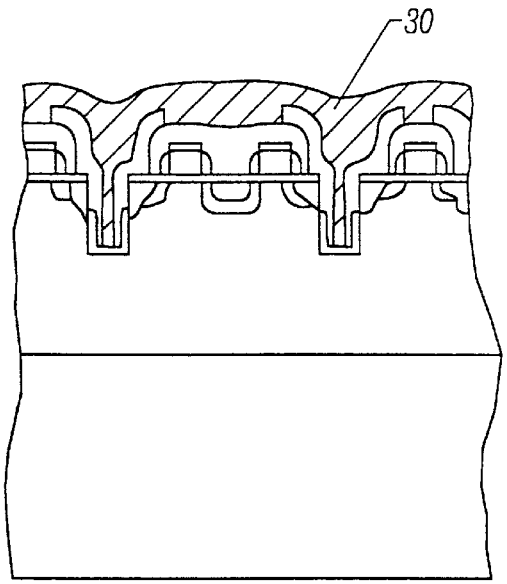
Figure 13:
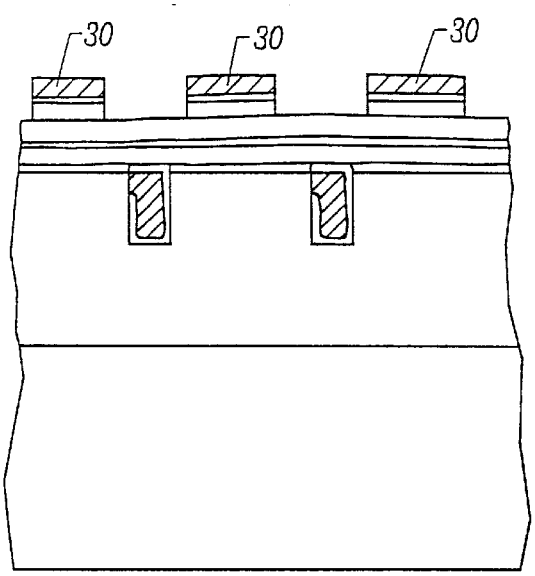

In completing the capacitor structure, an upper capacitor layer is deposited overlying the capacitor dielectric layer. This upper capacitor layer can be a heavily doped polysilicon layer for reducing resistance. The polysilicon layer can be doped using multiple angle implanting techniques or can be in-situ doped, depending upon the application. Steps of masking and etching define the upper capacitor layer into an upper capacitor plate, as illustrated by FIG. 13. The lower capacitor plate, the capacitor dielectric layer, and the upper capacitor plate define the capacitor structure. As shown, a portion of the capacitor structure lies over the field effect transistor as well as the trench to increase capacitor surface area, thereby providing greater capacitance.

Figure 14:
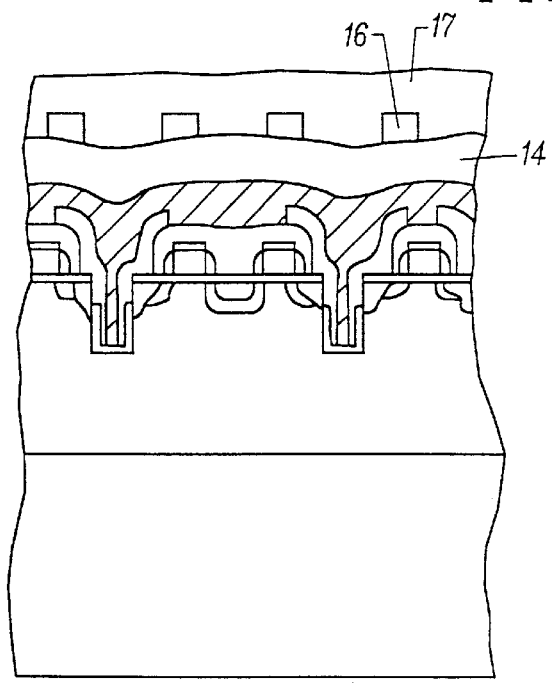
Figure 14:
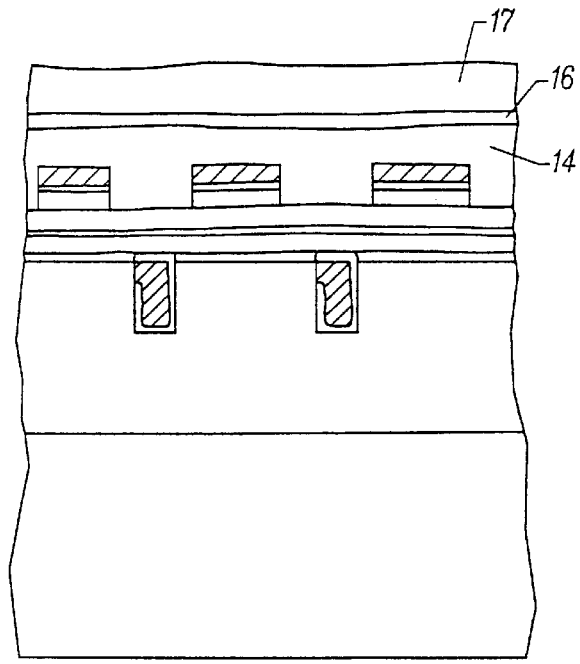

Thick layers 14 of BPSG/NSG deposit overlying the top surface of the entire substrate, as illustrated by FIG. 14. Typical CVD techniques deposit the combination of BPSG/NSG layers. These BPSG/NSG layers isolate the lower device structures from upper metallization. The BPSG/NGS layers are flowed using an annealing step. A surface of these layers is masked with photoresist to define contact openings. An etching process forms these contact openings. The photoresist is then stripped using conventional techniques.

A first metal layer is formed overlying these layers and is formed in the contact openings to provide electrical connections. A process of masking and etching patterns the first metal layer 16, as illustrated by FIG. 14. An inter-metal oxide layer 17 is deposited overlying the patterned first metal layer 16. Typical CVD techniques deposit this inter-metal oxide layer.

A via pattern is defined in the inter-metal oxide layer using conventional photoresist and etching techniques. This via pattern provides openings used for electrical contacts between the first metal layer and the second metal layer. This second metal layer is sputtered overlying the inter-metal oxide and is sputtered into the vias. A step of patterning defines the second metal layer.

Remaining fabrication steps include deposition of a passivation layer, including a silicon nitride layer and a silicon dioxide layer. This passivation layer is patterned to form openings for bonding pad regions and fuse openings. The openings are made by etching techniques. The entire surface is then coated with polymide. A final masking and etching step patterns this coated surface. After patterning, the coated surface is cured. Further process steps include wafer sort, assembly, testing, and others.

While the above is a full description of the specific embodiments, various modifications, alternative constructions and equivalents may be used. For example, while the description above is in terms of a DRAM structure, it would be possible to implement the present invention with SRAM, or the like.

Therefore, the above description and illustrations should not be taken as limiting the scope of the present invention which is defined by the appended claims.

What is claimed is:

1. An integrated circuit comprising:

a semiconductor substrate;

a first recessed region and a second recessed region in said semiconductor substrate, said first recessed region having sides extending from a first bottom surface, said second recessed region having sides extending from a second bottom surface;

a first insulating layer adjacent to said semiconductor substrate and covering said first bottom surface and a portion of at least one of said sides of said first recessed region, and a second insulating layer defined overlying said second recessed region;

a field effect transistor, said field effect transistor including a first source/drain region adjacent to said first recessed region and a second source/drain region adjacent to said second recessed region;

a first conductor defined within said first recessed region, said first conductor being coupled to said first source/drain region to define a bit-line structure; and a second conductor defined within said second recessed region, said second conductor being coupled to said second source/drain region to define a capacitor structure.

2. The circuit of claim 1 wherein said first conductor comprises an in-situ doped polysilicon layer.

3. The circuit of claim 1 wherein said second conductor comprises an in-situ doped polysilicon layer.

4. The circuit of claim 1 wherein said second insulating layer comprises an oxide layer.

5. The circuit of claim 4 wherein said second insulating layer comprises an oxide layer and a nitride layer.

6. The circuit of claim 1 wherein said field effect transistor is an MOS transistor.

7. The circuit of claim 6 wherein said field effect transistor is provided in dynamic random access memory cell.

* * * * *